INVENTOR
ALBRECHT KARL HEINRICH THEODOR RABENAU
BY
Frank R. Jifani
AGENT

July 2, 1963 A. K. H. T. RABENAU 3,096,151

SEMI-CONDUCTOR $Tl_2Te_3$ AND ITS METHOD OF PREPARATION

Filed July 10, 1959 2 Sheets-Sheet 2

INVENTOR
ALBRECHT KARL HEINRICH THEODOR RABENAU

BY
AGENT

United States Patent Office 3,096,151

Patented July 2, 1963

3,096,151
SEMI-CONDUCTOR $Tl_2Te_3$ AND ITS METHOD OF PREPARATION

Albrecht Karl Heinrich Theodor Rabenau, Aachen, Germany, assignor to North American Philips Company, Inc., New York, N.Y., a corporation of Delaware Filed July 10, 1959, Ser. No. 826,341
Claims priority, application Germany July 23, 1958
7 Claims. (Cl. 23—50)

This invention relates to semi-conductor materials and to devices made of such materials, and in particular to thermo-electric devices employing the Peltier cooling effect. The invention also relates to methods of manufacturing the said materials and devices.

Many known semi-conductor elements and compounds are employed in the semi-conductor field, and, especially in the transistor and diode art several have become widely accepted because of their advantageous combination of properties required for this application. However, there are other fields of application of semi-conductor devices in which the known semi-conductor materials, while capable of performing the required functions to a certain extent, still do not possess the combination of properties required for this application to a sufficiently high extent to make them competitive with other devices operating on different principles and now in general use in this field. This is especially true for Peltier cooling devices, sometimes referred to as Peltier heat pumps or semiconductor refrigerators, for which the best of the known semiconductors, namely $Bi_2Te_3$ or mixed crystals thereof, do not yet exhibit the required low value of thermal conductivity combined with a sufficiently high value of thermo-electric power to equal in cost and efficiency the compression-type cooling device generally used in refrigerators.

One object of the present invention is to provide a new semiconductor material having a very low thermal conductivity and a high thermoelectric power so that it is particularly suitable for use in thermoelectric devices employing the Peltier cooling effect.

A further object of the invention is a method for making semiconductor materials exhibiting low thermal conductivity yet high thermoelectric power.

The concept underlying the invention is that a material possessing the required properties exists in the thallium-tellurium system. This system Tl/Te was examined several times before 1940, and, according to Gmelin, "Handbuch der anorganischen Chemie," 8th edition, the compounds $Tl_2Te$, $Tl_3Te_2$, TlTe, $Tl_5Te_3$ and $Tl_2Te_5$ were found to exist. However, in "Zeitschrift für anorganische allgemeine Chemie," 260, 110 (1949), the existence of several of these compounds is denied, and an extensive X-ray diffraction analysis of the system Tl/Te is described, from which it was ascertained that samples of compositions ranging from TlTe to $TlTe_{2.5}$, which were heated for 24 hours at temperatures varying from 200° C. to 400° C. in accordance with the proportion of tellurium, showed only a single phase belonging to the compound TlTe.

The new semi-conductor material of the invention is the compound $Tl_2Te_3$, and mixed crystals of this compound, in which the structure of the compound is retained while part of the thallium or the tellurium or both is replaced by other suitable elements. It has been found that this compound $Tl_2Te_3$ exists and possess excellent properties as a semi-conductor. For example, it possesses a high thermo-electric power, a low thermal conductivity, a high temperature coefficient of resistance, and a high sensitivity to radiation. These properties render this compound and its isomorphous mixed crystals suitable for use in semi-conductor devices for which at least one of these properties is of importance, for example, for temperature-dependent resistors. However, the material in accordance with the invention is especially suitable for use in thermoelectric devices, for example, in a Peltier refrigerator, in which, according to the invention, at least one leg is made of the new material. Preferably such a device in accordance with the invention has at least two successive legs each made of the new semiconductor material but having opposite types of conductivity.

The invention will now be described more fully with reference to the accompanying drawings, in which:

FIGS. 1*a* and 1*b* are line spectrums obtained by a powder diffraction analysis of two somewhat similar materials of which only the second material is the new compound of the invention;

Figure 1:
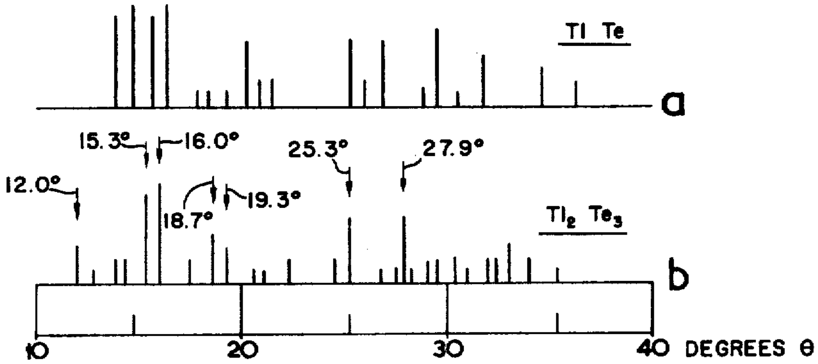

There will first be described one method for making the new material of the invention and the manner in which it may be distinguished from somewhat similar materials which, however, do not possess the unusual combination of properties exhibited by the inventive material.

*Example I*

A sample of thallium of a purity higher than 99.5% was subjected to a milling machine operation in an argon atmosphere until its surface appeared bright. The sample then weighed $47.34_8$ gms. Then, the sample was introduced in an argon atmosphere into a glass tube closed at one end. To obtain the stoichiometric composition of the compound $Tl_2Te_3$, $44.34_2$ gms. of twice-distilled tellurium was added to the tube. Next, the tube was evacuated, sealed tight and then heated in an electric furnace to a temperature of 450° C., and held at this temperature for about 20 minutes. During this heating step, the tube was shaken to intimately mix its molten contents. Next, the furnace was cooled to 245° C. and maintained at this temperature for 5 days. Afterwards, the tube was removed from the furnace and cooled further in air. One quarter of the tube contents was removed, and this quarter will be referred to hereinafter as sample 1. The remainder was again sealed back in the tube, which was then placed in a furnace and heated at 200° C. for 5 additional days. The tube was then removed, a part of its contents removed, which part will be referred to hereinafter as sample 2, and the remaining part resealed in the tube and reheated to 200° C. and maintained thereat for 12 additional days. The remainder of the tube contents will be referred to hereinafter as sample 3.

The three samples were then analyzed by means of X-ray powder diffractometry according to the asymmetrical method of Straumanis. The X-ray apparatus used was a Müller Mikro 101 with stabilized voltage. The analyzing radiation was Cu $k\alpha$ filtered by nickel; the radius of the film chamber was 57.3 mms.; the exposure time was 3 hours at an X-ray tube voltage of 35 kv. and tube current of 25 ma. FIG. 1 shows the line spectrums obtained on the film, with FIG. 1*a* obtained from sample 1 and FIG. 1*b* from sample 3. The estimated values of the intensities are plotted linearly in arbitrary units along the vertical axis while the angle of deflection $\theta$ of the diffracted beam is plotted horizontally. From FIG. 1, it will be seen that the X-ray diagram of sample 3 (FIG. 1*b*) is clearly distinguished from that of sample 1 (FIG. 1*a*). The X-ray diagram of the sample 1 is found in qualitatively equal form for the compound TlTe, which was produced separately in the above-mentioned manner with a corresponding composition of the components in order to provide a comparison with samples 2 and 3. The sequence of lines in FIG. 1*b* derived from sample 3 is characteristic of the compound $Tl_2Te_3$ or of mixed crystals thereof. The lines indicated by arrows in FIG. 1*b* can be used to detect the presence of the compound in accordance with the invention or mixed crystals thereof from an X-ray diagram. The sample 2 showed no radiographical difference with the sample 3, so that the sample 2 also consisted of the compound in accordance with the invention, whereas in the sample 1 the compound in accordance with the invention had not been formed, the reason for which will be explained later.

As a further means of distinguishing the compound $Tl_2Te_3$ from other similar compositions, the samples were studied under a microscope. To this end, a portion of the sample was ground, polished and etched. When magnified a hundred times, the ground faces showed that the sample 1 consisted of a primary crystallization embedded in a eutectic, so that there were two phases present. In contradistinction thereto, the sample 3 in accordance with the invention showed a single phase of a uniform crystal structure, some of the crystals having sizes up to a few tenths of a millimeter. Since the stoichiometrical composition was employed, this single phase had to be $Tl_2Te_3$. In the sample 2 in accordance with the invention, this latter structure had not yet been formed so completely.

Both methods of examination show unambiguously that the samples 2 and 3 are the compound $Tl_2Te_3$ in accordance with the invention, whereas the sample 1 was not converted into this compound, apparently since it was heated above the decomposition temperature of the compound of the invention.

Subsequently, measurements of the electrical conductivity, the thermoelectric power or thermo-E.M.F. and the Hall constant were made on the various samples in a conventional manner. For this purpose, smaller samples of about 8 by .1 by 3 cubic mms. were cut from the polycrystalline solid material. Ohmic contacts were applied to the samples by alloying thereto bismuth-plated copper wires. This was done by local heating for a short period of time. In the Hall constant measurement, a magnetic field strength of 5400 gauss was used. The results at two different measuring temperatures, namely room temperature, 20° C., and −180° C. are shown in the following table.

| | Sample 1 | Sample 2 | Sample 3 |
|---|---|---|---|
| Electrical conductivity $\gamma$ in ohm$^{-1}$, cm.$^{-1}$, T=20° C | $5.2\times10^{2}$ | $4.5\times10^{-2}$ | $3.1\times10^{-2}$ |
| Hall constant R in cm.$^3$/A. sec., T=20° C | $+7\times10^{-3}$ | $+7.0\times10^{2}$ | $+1.7\times10^{2}$ |
| Thermo-E.M.F. N in micro-volts/degree, T=20° C | +50 | +800 | +800 |
| Conductivity $\gamma$ in ohm$^{-1}$, cm.$^{-1}$, T=−180° C | $1.1\times10^{+3}$ | $4.0\times10^{-7}$ | $1.7\times10^{-9}$ |
| Hall constant R in cm.$^3$/A sec., T=−180° C | $+1.2\times10^{-2}$ | $>>3\times10^{4}$ | $>>4\times10^{6}$ |

From this table, it will be seen that sample 1 exhibits metallic behaviour in its electrical properties, while the results for samples 2 and 3 in accordance with the invention are characteristic of semiconductors. Furthermore, the table shows that samples 2 and 3 in accordance with the invention have a particularly high thermo-E.M.F.

Figure 2:
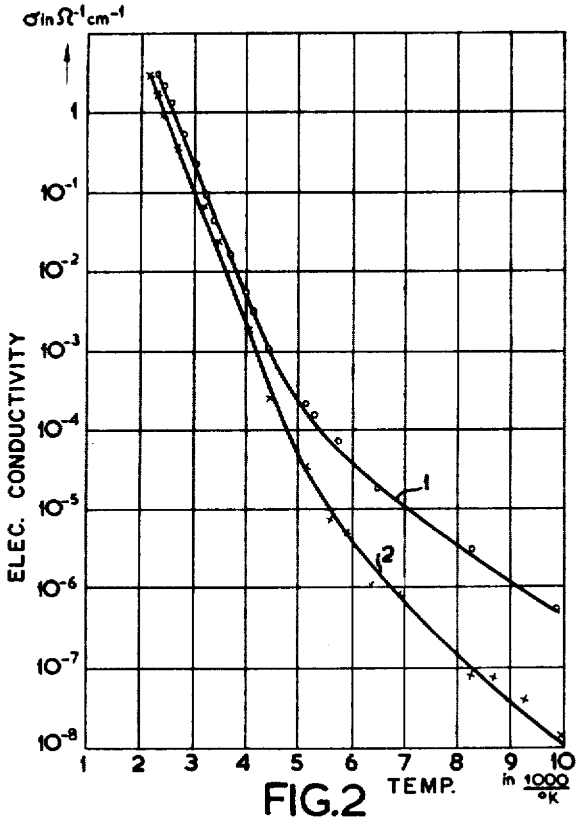
FIG. 2 is a graphical representation of the temperature dependence of conductivity of two sample materials of the invention.
Figure 3:
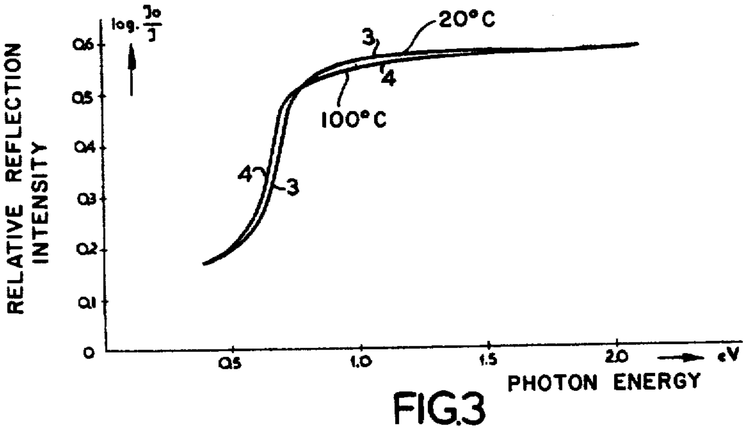
FIG. 3 is a graphical representation of the variation of the absorption of incident light for a material in accordance with the invention at two different temperatures.

Furthermore the temperature-dependence of the electric conductivity was measured on samples 2 and 3 in accordance with the invention. FIG. 2 shows the curves resulting from these measurements, the logarithm of the conductivity in ohm$^{-1}$cm.$^{-1}$ being plotted as the ordinate and $1000/T$ as the abscissa, where T is the temperature in ° K. The curve 1 is for the sample 2 and the curve 2 for the sample 3. From the slope of the straight portions of these curves, activation energies of 0.65 ev. and 0.63 ev. are found for the samples 2 and 3, respectively. In order to identify this measured activation energy, the band spacing was determined optically in the following manner. The measurement was made on a powdered sample by means of remission measurement. This method of measuring is based on a comparison of the spectral intensities I and $I_0$ which are reflected by the sample to be examined and by a layer of MgO as a standard. FIG. 3 shows the measurements, log $I_0/I$ (measure of the absorption) being plotted as the ordinate against the photon energy in electronvolts as the abscissa. The curves 3 and 4 show the measurements made at room temperature and at 100° C., respectively. In the range of the absorption edge, the curves show a substantially rectilinear variation. From the curve 3, an optical band spacing of about 0.65 ev. is found for the sample at 20° C.

The substantial equality of the optically measured band spacing of $Tl_2Te_3$ and of the activation energy shown in FIG. 2 makes it highly probable that the straight portions of the curves 1 and 2 of FIG. 2 show the ranges of intrinsic conduction of the samples in accordance with the invention. From the measurements given, and the supposition that the conventional formulas for semiconductors may also be used for this case, and assuming an effective mass equal to the electron mass, there is found at room temperature for the carrier mobility a sum total of the electron and hole mobilities between about 1000 cm.$^2$/v. sec. and 10,000 cm.$^2$/v. sec. and a difference of the mobilities of the order of about 10 cm.$^2$/v. sec. to 50 cm.$^2$/v. sec. With a smaller effective mass, still higher carrier mobilities are found, while smaller carrier mobilities require an effective mass larger than 1. In any case, it will be seen from these measurements that the semi-conductor compound in accordance with the invention has particular properties with respect to these qualities also.

In order further to examine the suitability of the compound in accordance with the invention for use in thermoelectric devices, the thermal conductivity $\lambda$ of the sample 3 was determined in the usual manner. It was about $6\times10^{-3}$ w./cm. degree. This value is materially lower than that of other semiconductors which might be considered for use in thermoelectric devices, and it is indeed surprising that the compound in accordance with the invention at the same time has a thermo-E.M.F. which is materially higher than the values measured on other compounds of this kind. These excellent properties also prove the particular suitability of the semi-conductor compound in accordance with the invention (and, as will be shown hereinafter, of the mixed crystals of this compound) for use in thermoelectric devices, for example, in Peltier refrigerating elements.

In order to ascertain the conditions of formation, a number of tests were made on samples which were produced by fusion of the stoichiometric composition at different temperatures and with the use of different heating periods. The samples were identified by means of X-ray analysis. The results were as follows:

(*a*) In a sample heated for 20 minutes at 450° C. and subsequently quenched at room temperature, no $Tl_2Te_3$ could be detected.

(*b*) In a sample heated at 245° C. for 3 days after fusion, no $Tl_2Te_3$ could be detected.

(*c*) A sample, heated for 3 days at 210° C. after fusion, was converted to the compound $Tl_2Te_3$ in accordance with the invention, and this was also the case for a sample heated for 3 days at 200° C. after fusion.

(*d*) A sample, heated at 180° C. for 3 days after fusion, was converted almost completely into the compound in accordance with the invention, whereas in a sample annealed for 3 days at 150° C., the conversion could hardly be detected, since at this temperature the duration of treatment was too short.

By these temperature treatments, an accurate value of the decomposition temperature could not be determined, since it is very difficult in practice to keep the annealing temperature exactly at a predetermined temperature for so long a period of time. A more accurate indication on the decomposition temperature was found by means of the following experiment:

For an accurate determination of the decomposition temperature of $Tl_2Te_3$, the following heat-treatments were carried out with samples of different composition. The starting material consisted of three samples having compositions between TlTe and $Tl_2Te_3$. These samples were heated at 220° C. for 600 hours; after the experiments, they were thermally stable; they contained 55, 59 and 59.3 atomic percent of Te, respectively. With samples of such composition, observation of a possible partial melting of the sample when heated to a temperature in the proximity of the decomposition temperature permits of ascertaining with certainty whether the decomposition temperature has been exceeded, since in this event the sample decomposes into TlTe and a liquid phase. The samples were compressed to form pellets, which were sealed in glass tubes. They were heated in the Höppler thermostat having a filling of silicone oil. The temperature constancy of the thermostat was approximately 0.2° C. The absolute value of the temperature was read from a calibrated mercury thermometer. The following heat-treatments were carried out:

1st treatment: The three samples were heated at 225° C. for 100 hours. Observation by microscope showed no sign of partial melting. Hence, this temperature was certainly lower than the decomposition temperature.

2nd treatment: The three samples were heated at 236° C. for 100 hours. Observation by microscope showed no sign of partial melting. Therefore, this temperature also was certainly lower than the decomposition temperature.

3rd treatment: The three samples were heated at 237° C. for 100 hours. At this temperature, partial melting could not be ascertained with certainty.

4th treatment: The three samples were heated at 238° C. for 100 hours. At this temperature, in all three samples visual observation revealed partial melting. Hence, this temperature was at least equal to the decomposition temperature.

Thus, these experiments show that the decomposition temperature for the compound $Tl_2Te_3$ is just below 238° C. and is approximately 237° C.

From further tests, it was also found that preparations produced in the manner described with respect to sample 1 and the compositions of which ranged from TlTe to $TlTe_{1.5}$ showed metallic behaviour when they were heated above about 238° C., the composition $TlTe_{1.5}$ not distinguishing itself by any discontinuity (thermal arrest) of its properties (even radiographically). If, however, this composition is heated for a prolonged period of time below the decomposition temperature, the compound $Tl_2Te_3$ in accordance with the invention was produced having a particular structure as shown by the Debye powder analysis and exhibiting an abrupt variation of its properties, which are typical for a semiconductor.

To sum up, it is therefore evident that, in order to carry out the manufacture of the new material of the invention, it must be prepared at a temperature below the decomposition temperature of the desired compound in the solid state. To this end, the components or the compounds supplying these components in a suitable mixing ratio are heated before or after being shaped into the form desired for the body, at a temperature below the decomposition temperature of the desired compound in the solid state for a sufficiently long period of time until the desired compound is produced. The compound $Tl_2Te_3$, or the isomorphous mixed crystals thereof, decompose in the solid state above a comparatively low temperature, so that they can be produced only below the decomposition temperature associated with the desired compound, and, as noted, the conversion requires a comparatively long period of time. This explains why hitherto this compound has not been found in spite of various researches into the system Tl/Te, since in the suitable range of compositions the temperature was chosen above the decomposition temperature and possibly the heating period was chosen too short. The decomposition temperature for the compound $Tl_2Te_3$ lies below about 238° C. It should be noted that the decomposition temperature of the isomorphous mixed crystals can differ from the decomposition temperature of the compound. Heating preferably is effected below about 238° C. and even below 230° C. Obviously, the reaction velocity is higher at a higher temperature. Below 150° C., the required heating period becomes prohibitively large for practical purposes, so that heating is preferably effected above 150° C. The temperature range between about 180° C. and about 238° C. is particularly suitable. Furthermore, heating is preferably effected in a non-oxydizing atmosphere, such as hydrogen, argon or a vacuum.

The components concerned or the compounds supplying these components or both are preferably heated as a finely-divided powdered mixture, before or after shaping of the mixture into the form desired for the body, for example by compression. In practice, particularly good results are also obtained by melting together the components concerned or the compounds supplying these components or both and subsequently heating them in a temperature range below the decomposition temperature of the desired compound. Preferably, this latter process is carried out by cooling the melt to a temperature below the decomposition temperature, whereupon they are heated at this temperature in order to form the required compound. Obviously, there is a large variety of manners in which such a method can be carried out. Thus, the fused mixture may be powdered and subsequently heated for conversion into the desired compound, if desired after it has been shaped into the form desired for the body. If a sintered body is to be made, the powdered mixture is preferably compressed at a temperature below the decomposition temperature of the desired compound and simultaneously or subsequently heated for conversion into the desired compound.

After the semi-conductor body has been heated for conversion into the desired compound, the body will generally have to be subjected, at least locally, to a further heat treatment, for example, for providing it with electrical contacts. According to a further feature of the invention, such a heat treatment is preferably effected below the decomposition temperature, or this further heat treatment is performed for such a short period of time above the decomposition temperature that the duration of the heat treatment is too short to give rise to decomposition of the compound. As a further alternative, the further heat treament can be effeced above the decomposition temperature, after which the body is heated to a temperature below the decomposition temperature in order to regenerate the desired compound. For many applications, the body must be provided with at least one ohmic contact. According to still a further feature of the invention, use is preferably made of a contact consisting of an alloy containing bismuth which is alloyed to the body. Obviously, other contact materials may also be used.

An example of a body made by a powder technique is now described:

*Example II*

Since thallium cannot be powdered, TlTe was used as the starting material. This was ground to form a powder together with an amount of tellurium stoichiometrically required to produce the compound $Tl_2Te_3$, the resulting powder being compressed to form bodies under a pressure of about 1 ton/cm.$^2$. The shape and dimensions of the bodies so formed were: pills having a diameter of 22 mms. and a height of from 8 to 10 mms., and rods of 5 by 5 by 10 mm.$^3$. These were heated in vacuum or in a protective gas atmosphere, e.g., hydrogen and argon, at 200° C. After 8 days at this temperature, the samples were removed from the furnace, and it was found from X-ray analysis that the compound in accordance with the invention had been formed. Furthermore, the measured values of the electric and thermal properties were of the same order of magnitude as described with respect to sample 3 in Example I.

The invention relates not only to the compound $Tl_2Te_3$ but also to isomorphous mixed crystals resulting from this compound. The formation of mixed crystals is a known, generally-used process in semiconductor technology for the purpose of conversion of a compound which in a certain respect is particularly suitable for a special purpose into a mixed crystal which, in addition, has other useful properties for this special purpose. Thus, for example, for use in Peltier refrigerators, part of the thallium of the compound may be replaced by gallium or indium, and part of the tellurium by sulphur or selenium in order to reduce the thermal conductivity. Oviously, the formation of mixture crystals is not restricted to these replacements; the thallium might also be replaced with up to for instance 25 atomic percent of bismuth, lead or mercury. Furthermore the term "compound" obviously is not to be understood to mean the precisely stoichiometric compound $Tl_2Te_3$ only, but, in the manner usual in semiconductor technology, also includes any deviations from the precise stoichiometric composition which may occur within the phase limits and furthermore the additional introduction of active imperfections, more particularly, impurity atoms. These deviations from the stoichiometric composition, for example by the incorporation of a large relative quantity of thallium or tellurium, and the additional doping with impurity atoms such, for example, as, on the one hand, copper or silver and, on the other hand, a halogen such as iodine, may be used to modify the conductivity type or the conductivity or both of the body. Examples illustrating this follow.

*Example III*

In order to examine the formation of mixed crystals, a sample having a composition according to the formula $Tl_{2-x}A_xTe_3$, where A=indium and $x$=0.05 was annealed at various temperatures. The procedure was as follows: A piece of thallium, which was machine milled bright in an argon atmosphere and weighed $25.463_5$ gms., was inserted, in an argon atmosphere, in a glass tube closed at one end. $24.442_9$ gms. of tellurium and $0.367_1$ gms. of indium were added to the tube. Then the tube was evacuated (weak vacuum) and sealed. The purity of the thallium and tellurium was the same as in Example I and the indium was spectrally pure. The tube was heated in a furnace for half an hour to 500° C., shaken for homogenization, and subsequently cooled in the furnace to about 100° C. and then removed. The duration of the cooling was about 3 hours. The sample preparation was taken from the glass tube, a part was removed and the remainder again sealed in vacuum. This latter part was heated to 350° C. so that it was completely molten and then cooled in air. Next, it was heated at 200° C. in the furnace and left at this temperature for 100 hours. Then the tube was taken from the furnace and cooled in air.

The sample cooled down from 500° C. showed substantially the same line spectrum as the sample 1 of Example I. See FIG. 1*a*. The sample heated at 200° C. showed only the lines of the compound $Tl_2Te_3$ in accordance with the invention. The thermo-E.M.F. and the thermal conductivity of the sample in accordance with the invention were measured. The thermo-E.M.F. was +380 microvolts/degree and the thermal conductivity was about 30% lower than the value given in Example I for the sample 3.

*Example IV*

This time a sample having a composition according to the formula $Tl_2Te_{3-y}B_y$, where B is selenium and $y$=0.05 was annealed at various temperatures. The procedure was exactly the same as described in Example III; however, the additions were: thallium $22.317_5$ gms., tellurium $20.551_1$ gms. and selenium $0.215_5$ gms. The purity of the elements thallium and tellurium was the same as in Example I. The selenium used had been distilled twice.

The sample which was cooled after being heated to 500° C. showed about the same line spectrum as the sample 1 of Example I (FIG. 1*a*) with, however, some additional lines. The sample heated at 200° C. substantially showed only the lines of the compound $Tl_2Te_3$ in accordance with the invention (FIG. 1*b*). The thermo-E.M.F. and the thermal conductivity of the mixed crystal sample in accordance with the invention were measured. The thermo-E.M.F. was +600 microvolts/degree at room temperature and the thermal conductivity was about 30% lower than the value given in Example I.

*Example V*

This time the mixed crystal constituted a deviation from the stoichiometric composition. A preparation containing a large relative quantity of tellurium and comprising $60.1_6$ atomic percent of tellurium and $39.8_4$ atomic percent of thallium was produced in a manner similar to that described in Example III and heated at 200° C. The amounts by weight were $4.904_3$ gms. of thallium and $4.624_2$ gms. of tellurium.

After heating, X-ray examination showed substantially the same line spectrum as for the stoichiomeric composition $Tl_2Te_3$ (FIG. 1*b*). The thermo-E.M.F. was +435 microvolts/degree.

*Example VI*

Similarly to Example V, a preparation containing a small relative quantity of tellurium and comprising $59.8_5$ atomic percent of tellurium and $40.1_5$ atomic percent of thallium was treated in the same manner as described in Example III and heated at 200° C. The amounts by weight were $6.133_6$ gms. of thallium and $5.707_3$ gms. of tellurium.

After annealing, X-ray examination showed substantially the same line spectrum as the stoichiometric composition $Tl_2Te_3$. The thermo-E.M.F. was +270 microvolts/degree.

*Example VII*

In a further examination of the formation of mixed crystals, 1.5 mol. percent of PbTe was added to a sample of the stoichiometric composition $Tl_2Te_3$ in accordance with the invention. Then the aggregate was ground, pressed to form pills and subsequently heated at 210° C. for 10 days. X-ray examination again showed the line spectrum of FIG. 1*b*. The thermo-E.M.F. was 650 microvolts/degree and the thermal conductivity was about 20% lower than that given in Example I for sample 3.

It should be noted that in the mixed crystals in accordance with the invention as described, for example, in Examples III to VII, X-ray examination may show small deviations in the line intensities and line spacings. However, the characteristic line sequence is always maintained. In order to identify the compound in accordance with the invention or mixed crystals thereof, obviously in addition to or instead of the X-ray examination, use may be made of examinations of the electrical and/or thermal properties, for, as has been described hereinbefore, in the formation of the compound in accordance with the invention or the mixed crystals thereof these properties show abrupt changes.

*Example VIII*

This example relates to doping with impurity atoms. To a powdered preparation consisting of the compound $Tl_2Te_3$ in accordance with the invention was added about 0.5 atomic percent of iodine. The aggregate was sealed in a vessel in argon under a pressure of from 10 mms. to 100 mms. and subsequently heated at 200° C. for 3 days. Then the sample was taken out and compressed to form a pill and subsequently again heated at 200° C. for 3 days. Measurements showed a thermo-E.M.F. of about +700 microvolts/degree, and an electrical conductivity about 3 times that of sample 3 (Example I). From this example and also from further similar doping tests, it was found surprisingly that in the compound in accordance with the invention and the isomorphous mixed crystals thereof the electron conductivity can be materially increased without a substantial reduction of the thermo-E.M.F. Thus, a similar behaviour was found when doping with copper, for example, with 0.5 atomic percent. By using similar doping techniques known in the art, the conductivity of the samples may be controlled.

Figure 4:
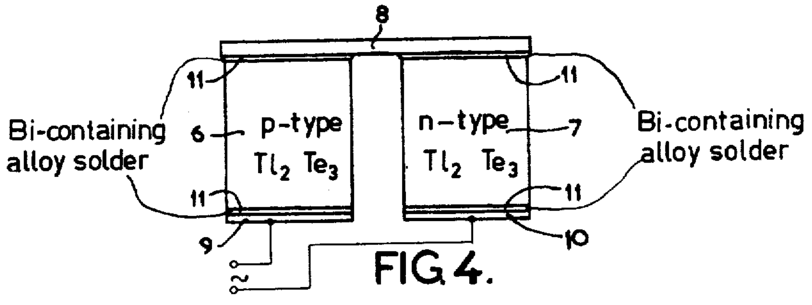
FIG. 4 is an elevational view of a constructional unit of a Peltier refrigerator in accordance with the invention.

Now, an application of the semiconductor compound in accordance with the invention will be described with reference to FIG. 4. This FIG. 4 is an elevational view of a constructional unit of a Peltier refrigerator. The physical construction of such a unit is well-known. It comprises two legs 6 and 7. These two legs are not soldered to one another directly. In order to improve the heat dissipation, at the upper side of the device a length 8 of a substance of high thermal and electrical conductivity, for example copper or silver, is inserted between the legs. In a device in accordance with the invention, at least one of the legs 6 and 7 contains or comprises at least one of the semiconductors in accordance with the invention; preferably both legs consist of a semiconductor material in accordance with the invention, the conductivity types of the two legs being opposite. The current is supplied and taken off at the lower side through contacts 9 and 10 in a manner such that at the upper side the Peltier heat is absorbed and at the lower side the Peltier heat is produced. According to the invention, the part 8 and the contacts 9 and 10 are soldered to the legs by means of an alloy 11 containing bismuth.

It will be appreciated that the invention is not restricted to this thermoelectric application in Peltier refrigerating elements or to the particular embodiment of such device, and that the semiconductors in accordance with the invention can be used to great advantage in other thermoelectric devices, for example thermoelement and thermoelectric heat pumps. Similarly, the semiconductor bodies in accordance with the invention can be used in other semiconductor devices. Neither is the invention restricted to the above described examples of production methods or to the above-described mixed crystal bodies. Thus, mixed crystals may be made with the use of different elements, and the formation of mixed crystals is not restricted to the values given by way of example. The conductivity type or the conductivity or both can be influenced in the ways generally used in this field of technology.

While I have described my invention in connection with specific embodiments and applications, other modifications thereof will be readily apparent to those skilled in this art without departing from the spirit and scope of the invention as defined in the appended claims.

What is claimed is:

1. A new semiconductor material comprising a single phase containing thallium and tellurium having a crystal structure isomorphous with that of $Tl_2Te_3$ and exhibiting a characteristic X-ray powder diffraction pattern containing substantially the line sequence indicated by the arrows in the graph of FIG. 1*b* of the accompanying drawing, wherein the abscissa is in degrees $\theta$ and the ordinate indicates relative line intensity, said single phase possessing a low thermal conductivity, a high thermoelectric power at room temperature of at least several hundred microvolts/° C., and an electrical conductivity in the semiconductor range.

2. A new semiconductor material comprising a single phase containing thallium and tellurium having a crystal structure isomorphous with that of $Tl_2Te_3$ and exhibiting a characteristic X-ray powder diffraction pattern containing substantially the line sequence indicated by the arrows in the graph of FIG. 1*b* of the accompanying drawing and obtained employing nickel-filtered copper K radiation, wherein the abscissa is in degrees $\theta$ and the ordinate indicates relative line intensity, said single phase possessing a low thermal conductivity, a high thermoelectric power at room temperature of at least several hundred microvolts/° C., and an electrical conductivity in the semiconductor range, said single phase further having a decomposition temperature of about 238° C.

3. A method of making a new semiconductor material comprising a single phase containing thallium and tellurium having a crystal structure isomorphous with that of $Tl_2Te_3$ and exhibiting a characteristic X-ray powder diffraction pattern containing substantially the line sequence indicated by the arrows in the graph of FIG. 1*b* of the accompanying drawing, wherein the abscissa is in degrees $\theta$ and the ordinate indicates relative line intensity, comprising the step of heating and reacting the structure-forming materials containing thallium and tellurium at a temperature below about 238° C. for a prolonged period of time sufficient to form the said single phase possessing a low thermal conductivity, a high thermoelectric power, and an electrical conductivity in the semiconductor range.

4. A method as set forth in claim 3 wherein the materials are heated in a non-oxidizing atmosphere at a temperature between about 150° C. and 238° C.

5. A method of making a new semiconductor material comprising a single phase containing thallium and tellurium having a crystal structure isomorphous with that of $Tl_2Te_3$ and exhibiting a characteristic X-ray powder diffraction pattern containing substantially the line sequence indicated by the arrows in the graph of FIG. 1*b* of the accompanying drawing, wherein the abscissa is in degrees $\theta$ and the ordinate indicates relative line intensity, comprising the step of heating the structure-forming materials, containing thallium and tellurium, in a pulverulent condition in a non-oxidizing atmosphere at a temperature between about 180° C. and 230° C. for a prolonged period of time sufficient to form the said single phase possessing a low thermal conductivity, a high thermoelectric power, and an electrical conductivity in the semiconductor range.

6. A method as set forth in claim 5 wherein the said materials are pre-fused before being pulverized and heated in the temperature range between about 180° C. and 230° C.

7. A method as set forth in claim 6 wherein the pulverized materials are compacted to form a body before heating.

References Cited in the file of this patent

UNITED STATES PATENTS

| | | |
|---|---|---|
| 2,008,753 | Downing et al. | July 23, 1935 |
| 2,602,095 | Faus | July 1, 1952 |
| 2,697,269 | Fuller | Dec. 21, 1954 |
| 2,707,319 | Conrad | May 3, 1955 |
| 2,762,857 | Lindenblad | Sept. 11, 1956 |
| 2,809,165 | Jenny | Oct. 8, 1957 |
| 2,858,275 | Folberth | Oct. 28, 1958 |
| 2,882,467 | Wernick | Apr. 14, 1959 |
| 2,893,831 | Bither | July 7, 1959 |

OTHER REFERENCES

Mellor: "Comprehensive Treatise on Inorganic and Theoretical Chemistry," Longmans, Green and Co., N.Y., 1931, page 54 (vol. II).

Hoffman: Lexikon der Anorganische Verbindungen, Band 1, 1 Halfte, No. 1–31, page 730.

UNITED STATES PATENT OFFICE

CERTIFICATE OF CORRECTION

Patent No. 3,096,151 July 2, 1963

Albrecht Karl Heinrich Theodor Rabenau

It is hereby certified that error appears in the above numbered patent requiring correction and that the said Letters Patent should read as corrected below.

Column 1, line 65, for "possess" read -- possesses --; column 3, in the table, lines 1 and 7 thereof, for "$\gamma$" read -- $\sigma$ --; same table, under "Sample 3" last line thereof, for "$>>4x10^6$" read -- $>>4x10^5$ --; column 5, line 20, for "the" read -- a --; column 6, line 18, for "non-oxydizing" read -- non-oxidizing --; column 7, line 20, for "mixture" read -- mixed --; column 9, line 39, after "such" insert -- a --.

Signed and sealed this 3rd day of March 1964.

(SEAL)
Attest:

ERNEST W. SWIDER

Attesting Officer

EDWIN L. REYNOLDS

Acting Commissioner of Patents